(12) United States Patent
Jung et al.

(10) Patent No.: US 10,968,364 B2
(45) Date of Patent: Apr. 6, 2021

(54) PLASMA POLYMERIZED THIN FILM HAVING LOW DIELECTRIC CONSTANT, DEVICE, AND METHOD OF PREPARING THIN FILM

(71) Applicant: Research & Business Foundation Sungkyunkwan University, Suwon-si (KR)

(72) Inventors: Donggeun Jung, Seoul (KR); Wonjin Ban, Suwon-si (KR); Sungyool Kwon, Suwon-si (KR); Yoonsoo Park, Gwangmyeong-si (KR); Hyuna Lim, Hwaseong-si (KR); Younghyun Kim, Seongnam-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/549,150

(22) Filed: Aug. 23, 2019

(65) Prior Publication Data
US 2020/0071565 A1    Mar. 5, 2020

(30) Foreign Application Priority Data
Sep. 5, 2018  (KR) .................. 10-2018-0105839

(51) Int. Cl.
*H01L 21/4763*    (2006.01)
*C09D 183/10*     (2006.01)
(Continued)

(52) U.S. Cl.
CPC ........... *C09D 183/10* (2013.01); *C08G 77/06* (2013.01); *C08G 77/42* (2013.01); *C09D 5/00* (2013.01);
(Continued)

(58) Field of Classification Search
CPC ......... H01L 21/02126; H01L 21/02216; H01L 21/02274; H01L 21/0234; H01L 23/5226;
(Continued)

(56) References Cited

U.S. PATENT DOCUMENTS 7,897,521 B2 *   3/2011   Jung .................. B05D 1/62
                                            438/781
7,968,471 B2 *   6/2011   Harada ............. H01L 21/02304
                                            438/780

FOREIGN PATENT DOCUMENTS

KR    10-2010-0042022 A    4/2010
KR       10-0987183 B1    10/2010
KR    10-2015-0021179 a    3/2015

OTHER PUBLICATIONS

Korean Office Action dated Jan. 23, 2020 in counterpart Korean Patent Application No. 10-2018-0105839 (6 pages in Korean).

* cited by examiner

*Primary Examiner* — Luan C Thai
(74) *Attorney, Agent, or Firm* — NSIP Law

(57) ABSTRACT

A plasma polymerized thin film having low dielectric constant prepared by depositing a first precursor material represented by the following Chemical Formula 1:
(Continued)

[Chemical Formula 1]

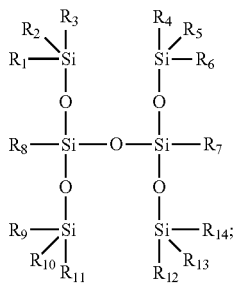

wherein in the above Chemical Formula 1, $R_1$ to $R_{14}$ are each independently H or a substituted or non-substituted $C_1$-$C_5$ alkyl group, and when the $R_1$ to $R_{14}$ are substituted, their substituents comprise an amino group, a hydroxyl group, a cyano group, a halogen group, a nitro group, or a methoxy group.

17 Claims, 11 Drawing Sheets

(51) Int. Cl.
  *C08G 77/06* (2006.01)
  *C08G 77/42* (2006.01)
  *C09D 183/04* (2006.01)
  *C09D 5/00* (2006.01)
  *H01L 21/02* (2006.01)
  *H01L 23/522* (2006.01)
  *H01L 23/532* (2006.01)

(52) U.S. Cl.
  CPC ........ *C09D 183/04* (2013.01); *H01L 21/0234* (2013.01); *H01L 21/02126* (2013.01); *H01L 21/02216* (2013.01); *H01L 21/02274* (2013.01); *H01L 23/5226* (2013.01); *H01L 23/5329* (2013.01)

(58) Field of Classification Search
  CPC ..... H01L 23/5329; C08G 77/06; C08G 77/42; C09D 183/04; C09D 183/10; C09D 5/00
  USPC ........................................ 438/623
  See application file for complete search history.

PLASMA POLYMERIZED THIN FILM HAVING LOW DIELECTRIC CONSTANT, DEVICE, AND METHOD OF PREPARING THIN FILM

CROSS-REFERENCE TO RELATED APPLICATION

This application claims the benefit under 35 U.S.C. 119(a) of Korean Application No. 10-2018-0105839 filed on Sep. 5, 2018, in the Korean Intellectual Property Office, the entire disclosure of which is incorporated herein by reference for all purposes.

BACKGROUND

1. Field

The present disclosure relates to a plasma polymerized thin film having low dielectric constant, a device, and a method of preparing a thin film.

2. Description of the Background

Currently, one of the main processes for manufacturing semiconductor devices is a process of forming metal and dielectric thin films on a substrate by gaseous chemical reaction. Such a deposition process is referred to as chemical deposition or chemical vapor deposition (CVD). In a typical thermal CVD process, a reactant gas is provided onto the surface of a substrate. Then, a thermally-induced chemical reaction occurs on the surface of the substrate and a predetermined thin film is formed thereon. The thermal CVD process is performed at a high temperature, and, thus, a structure of a device including the film on the substrate may be damaged due to the high temperature. Plasma-enhanced CVD (PECVD) is one of the methods for solving the above problem, i.e., for depositing metal and dielectric thin films at a relatively low temperature.

The PECVD is used to generate plasma with highly reactive species by applying radio frequency (RF) energy to a reaction zone and promoting excitation and/or dissociation of reactant gases. In this case, energy required to make a chemical reaction is reduced due to high reactivity of free radical species. Therefore, in the PECVD, temperature required to form a thin film can be reduced. With the introduction of such apparatus and method, semiconductor device structures have significantly decreased in size.

Meanwhile, when ultra-large scale integrated circuits of 0.5 μm or less are manufactured, silicon dioxide ($SiO_2$) or silicon oxyfluoride (SiOF), which has been mainly used as an interlayer insulating film until now, has problems such as high capacitance and resistance capacitance delay (RC delay). In recent years, to reduce the RC delay of a multi-layered metal film used for integrated circuits of a semiconductor device, research on the formation of an interlayer insulating film used for metal wires with a material having a low dielectric constant (relative dielectric constant k<3.0) has been actively conducted. Such a low-k thin film may be formed of an inorganic material, such as a SiCOH film containing Si, O, C, H, etc. and a fluorine-doped amorphous carbon film (a-C:F), or an organic material including carbon (C).

Examples of the low-k materials currently being considered as alternatives to $SiO_2$ may include benzocyclobutene (BCB), SILK (available from DOW CHEMICAL), fluorinated poly(arylene ether) (FLARE) (available from ALLIED SIGNALS), and organic polymers such as polyimide, which are mainly used for spin coating, and Black Diamond (available from APPLIED MATERIALS), Coral (available from NOVELLUS), and porous thin film materials such as xerogel or aerogel, which are formed by chemical deposition.

The material having a low k and formed by spin casting including spin coating followed by curing is formed as a low-k dielectric since pores having diameters of several nanometers are formed within the thin film, which results in a decrease in the density of the thin film. The above-described organic polymers typically deposited by spin coating have generally low k and excellent flatness. However, they have a heat-resistant threshold temperature lower than 450° C. and thus have poor thermal stability. Therefore, they may not be not suitable for application to semiconductor devices. Particularly, the pores are large and are not uniformly distributed in the thin film. Therefore, the thin film has a low mechanical strength, which causes various problems when manufacturing a semiconductor device. Further, the reliability of a semiconductor device deteriorates due to poor contact with upper and lower wiring materials, high stress caused by thermal curing of an organic polymer thin film, and change in dielectric constant caused by the adsorption of surrounding water.

Korean Patent No. 10-0987183 relates to a plasma polymerized thin film having low dielectric constant and a manufacturing method thereof and specifically discloses a plasma polymerized thin film having low dielectric constant manufactured by using organic or inorganic precursors and a manufacturing method thereof.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a plasma polymerized thin film having low dielectric constant is prepared by depositing a first precursor material represented by the following Chemical Formula 1:

[Chemical Formula 1]

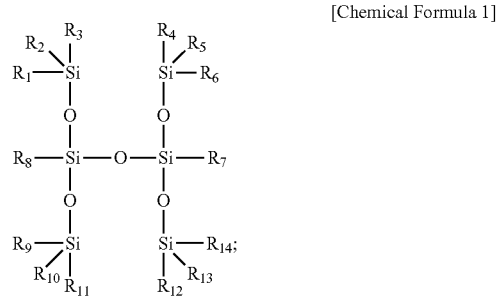

wherein in the above Chemical Formula 1, $R_1$ to $R_{14}$ are each independently H or a substituted or non-substituted $C_1$-$C_5$ alkyl group, and when the $R_1$ to $R_{14}$ are substituted, their substituents include an amino group, a hydroxyl group, a cyano group, a halogen group, a nitro group, or a methoxy group.

The plasma polymerized thin film having low dielectric constant may be prepared by depositing a second precursor material, which is hydrocarbon in a liquid state at about 25° C. and about 1 atm, together with the first precursor material.

The second precursor material may include $C_6$-$C_{12}$ alkane, alkene, cycloalkane, or cycloalkene.

The second precursor material may include cyclohexane.

The first precursor material may have an H-shaped structure.

The plasma polymerized thin film having low dielectric constant may be prepared by plasma-enhanced CVD (PECVD).

In another general aspect, a method of preparing a plasma polymerized thin film having low dielectric constant includes depositing a plasma-polymerized thin film on a substrate using a first precursor material represented by the following Chemical Formula 1:

[Chemical Formula 1]

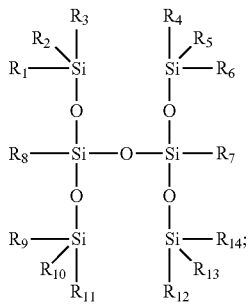

wherein in the above Chemical Formula 1, $R_1$ to $R_{14}$ are each independently H or a substituted or non-substituted $C_1$-$C_5$ alkyl group, and when the $R_1$ to $R_{14}$ are substituted, their substituents include an amino group, a hydroxyl group, a cyano group, a halogen group, a nitro group, or a methoxy group.

The depositing a plasma-polymerized thin film on a substrate may include depositing using a second precursor material, which is a hydrocarbon in a liquid state at about 25° C. and about 1 atm, together with the first precursor material.

The second precursor material may include $C_6$-$C_{12}$ alkane, alkene, cycloalkane, or cycloalkene.

The second precursor material may include cyclohexane.

The method may further include performing an after-treatment to the thin film deposited on the substrate.

The after-treatment may be performed through a process selected from the group including an inductively coupled plasma (ICP) process, a rapid thermal annealing (RTA), and a combination thereof.

The depositing a plasma-polymerized thin film on a substrate may include vaporizing the first precursor material and the second precursor material in a bubbler, transferring the vaporized precursor materials from the bubbler and introducing the transferred precursor materials into a plasma deposition reactor, and forming a plasma-polymerized thin film on the substrate in the reactor by using plasma of the reactor.

The reactor may contain a carrier gas selected from the group including argon (Ar), helium (He), neon (Ne), and combinations thereof.

The carrier gas in the reactor may have a pressure of from about $1\times10^{-1}$ Torr to about $100\times10^{-1}$ Torr.

The substrate in the reactor may have a temperature of from about 20° C. to about 200° C., but may not be limited thereto.

Power supplied to the reactor may be from about 10 W to about 90 W.

In another general aspect, a semiconductor device includes multilayered metal wires, and a dielectric thin film disposed on one or more of a layer of the multilayer metal wires, wherein the dielectric thin film comprises a reaction product of a first precursor material comprising an H-shaped structure represented by the following Chemical Formula 1:

[Chemical Formula 1]

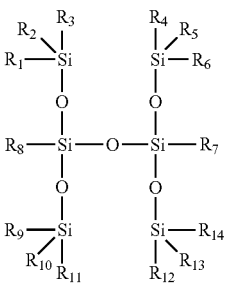

wherein in the above Chemical Formula 1, $R_1$ to $R_{14}$ are each independently H or a substituted or non-substituted $C_1$-$C_5$ alkyl group, and when the $R_1$ to $R_{14}$ are substituted, their substituents include an amino group, a hydroxyl group, a cyano group, a halogen group, a nitro group, or a methoxy group.

The reaction product may include a plasma polymerized reaction product.

C—$H_x$ bonding structures, Si—$CH_3$ bonding structures, Si—$(CH_3)_x$ bonding structures and Si—O—Si bonding structures may constitute a majority of the dielectric thin film, and the dielectric thin film may include a relative dielectric constant (k) value of about 1.9 to about 3.4.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
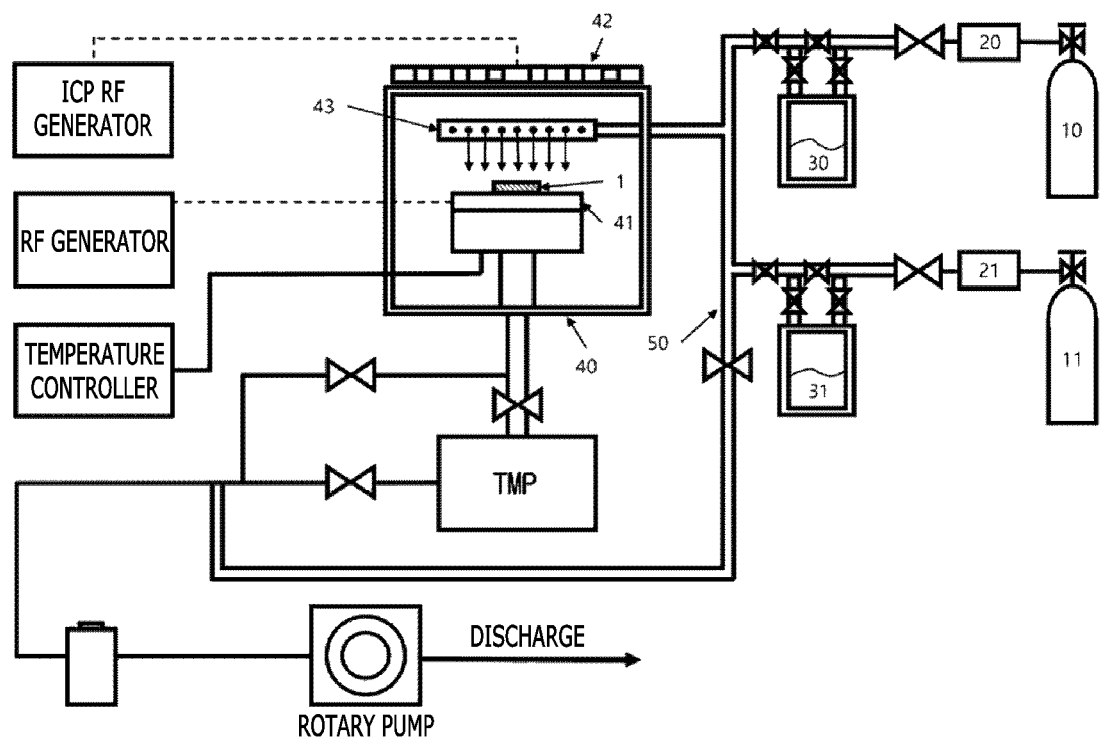
FIG. 1 is a schematic diagram of a plasma-enhanced chemical vapor deposition (PECVD) apparatus used for preparing a plasma polymerized thin film having low dielectric constant according to an example of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

As used herein, the terms "includes," "comprises," "including" and/or "comprising," specify the presence of stated elements and/or components, but do not preclude the presence or addition of one or more other elements and/or components, unless explicitly stated otherwise.

As used herein, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. As used herein, the term "step of" does not mean "step for".

As used herein, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

In view of the foregoing, the present disclosure provides a plasma-polymerized thin film having a low dielectric constant and a method of preparing a thin film.

However, problems to be solved by the present disclosure are not limited to the above-described problems. There may be other problems to be solved by the present disclosure.

Hereafter, a plasma polymerized thin film having low dielectric constant and a preparing method thereof according to the present disclosure will be described in detail with reference to embodiments, examples, and the accompanying drawings. However, the present disclosure may not be limited to the following embodiments, examples, and drawings.

A first aspect of the present disclosure provides a plasma polymerized thin film having low dielectric constant prepared by depositing a first precursor material represented by the following Chemical Formula 1:

[Chemical Formula 1]

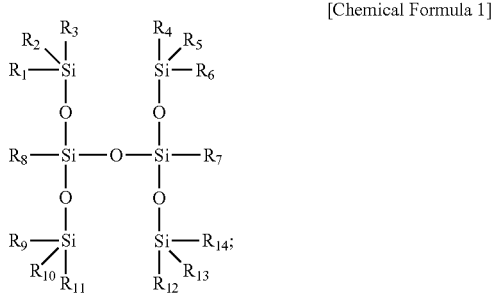

In the above Chemical Formula 1, $R_1$ to $R_{14}$ are each independently H or a substituted or non-substituted $C_1$-$C_5$ alkyl group, and if the $R_1$ to $R_{14}$ are substituted, their substituents may include an amino group, a hydroxyl group, a cyano group, a halogen group, a nitro group, or a methoxy group.

The first precursor may be represented by the following Chemical Formula 2, but may not be limited thereto:

[Chemical Formula 2]

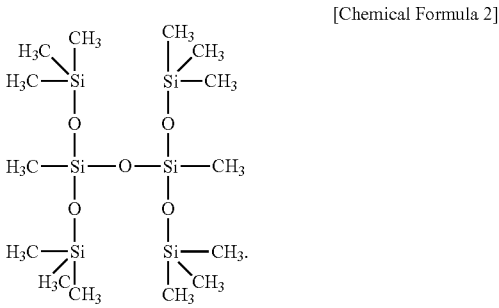

The plasma polymerized thin film having low dielectric constant of the present disclosure is prepared using a first precursor material having an H-shaped structure different in structure from a precursor material which has been conventionally used for a plasma polymer and has nanopores within the plasma-polymerized thin film. Thus, the plasma polymerized thin film having low dielectric constant can have a mechanical strength required for conventional semiconductor process and a lower dielectric constant value.

Further, the plasma polymerized thin film having low dielectric constant of the present disclosure is prepared using the first precursor material and thus thermally stable and has a very low dielectric constant. Thus, it can substitute for a dielectric which is used for multilayered metal wires of a semiconductor device and can also improve resistance capacitance delay (RC delay) which increases with the miniaturization of the multilayered metal wires.

In accordance with an embodiment of the present disclosure, the plasma polymerized thin film having low dielectric constant may be prepared by depositing a second precursor material, which is a hydrocarbon in a liquid state at 25° C. and 1 atm, together with the first precursor material, but may not be limited thereto. Meanwhile, the plasma polymerized thin film having low dielectric constant may be prepared using only the first precursor material without using the second precursor material.

The second precursor material may be hydrocarbon in a liquid state at 25° C. and 1 atm. If the second precursor material is a hydrocarbon, it can have good bonding force with respect to the first precursor material and can make it easy to form a plasma-polymerized thin film. Further, it has advantages in that the mechanical strength and the elasticity of the film can be improved due to the presence of multiple C—$H_x$ bonding structures. Furthermore, the second precursor material is preferably a hydrocarbon in a liquid state under standard conditions (25° C. and 1 atm) as described above for the application to a bubbler of a plasma-enhanced chemical vapor deposition (PECVD) apparatus to be described later. In general, it is easy to apply a material in a liquid state under the standard conditions to a bubbler. Further, the material in a liquid state has a higher stability in the deposition of a thin film than in a solid state and can be stored in a greater amount than in a gas state. Thus, hydrocarbon in a liquid state may be desirable in consideration of the function of the bubbler (i.e., vaporization of a precursor).

In accordance with an embodiment of the present disclosure, the second precursor material may include $C_6$-$C_{12}$ alkane, alkene, cycloalkane, or cycloalkene, but may not be limited thereto. If the carbon number of the second precursor material is less than $C_6$, it is difficult for the second precursor material to be in a liquid state under the standard conditions. Further, since the second precursor material has a low molecular weight, the cross-linking power with the first precursor material decreases. Thus, a thin film may not be easily deposited. Meanwhile, if the carbon number of the second precursor material is greater than $C_{12}$, the second precursor material may be in a solid state under the standard conditions. Thus, it may be difficult to vaporize the second precursor material from the bubbler.

In accordance with an embodiment of the present disclosure, the second precursor material may include cyclohexane, but may not be limited thereto.

The first precursor material and the second precursor material may be combined and used at the same time. As described above, the first precursor material and the second precursor material can readily form cross-linking due to their chemical and structural characteristics. Thus, the stability of the thin film can increase. Therefore, a plasma-polymerized thin film having improved mechanical properties with a low dielectric constant can be provided.

In accordance with an embodiment of the present disclosure, the first precursor material may have an H-shaped structure, but may not be limited thereto. A plasma polymerized thin film having low dielectric constant can be prepared using the first precursor material having an H-shaped structure and thus can have a mechanical strength required for conventional semiconductor process and a lower dielectric constant value than a plasma-polymerized thin film prepared using a conventional precursor.

In accordance with an embodiment of the present disclosure, the plasma polymerized thin film having low dielectric constant may be prepared by plasma-enhanced chemical vapor deposition (hereinafter, referred to as "PECVD"), but may not be limited thereto. As described above, the PECVD is used to generate plasma with highly reactive species, and, thus, the first precursor material and the second precursor material can be effectively dissociated or excited to perform various chemical reactions, and for example, they may be bonded and polymerized to form a plasma-polymerized thin film. This plasma-polymerized thin film may have pores of a nanometer size or less and thus may have a low dielectric constant and a relatively high mechanical strength.

When a thin film is deposited by the PECVD, the first precursor material and the second precursor material are supplied at one predetermined ratio. Thus, a thin film in which the first and second precursor materials are present at another predetermined ratio can be formed. Further, the supplied amount and the ratio of the first precursor material and the second precursor material may be controlled by adjusting the temperature of the bubbler or the flow rate of a carrier gas such as argon (Ar). For example, a thin film may be deposited by setting the flow rate ratio of a first carrier gas and a second carrier gas, which corresponds to the ratio of the first precursor material and the second precursor, to the range of from 1:1 to 1:5. If the flow rate ratio of the second carrier gas is greater than 5 times with respect to the first carrier gas, SiOx within the thin film is significantly reduced and the thin film is difficult to use as an interlayer insulating film, and if the flow rate ratio of the second carrier gas is less than the flow rate ratio of the first carrier gas, the second precursor material may not be sufficiently supplied into the thin film.

Furthermore, the plasma-polymerized thin film may undergo an after-treatment by an RTA apparatus or an ICP apparatus after being deposited through the PECVD. By conducting the after-treatment, it was verified that the dielectric constant of the plasma-polymerized thin film according to the present disclosure significantly decreased (see FIG. 9).

A second aspect of the present disclosure provides a preparing method of a plasma polymerized thin film having low dielectric constant, including depositing a plasma-polymerized thin film on a substrate using a first precursor material represented by the following Chemical Formula 1:

[Chemical Formula 1]

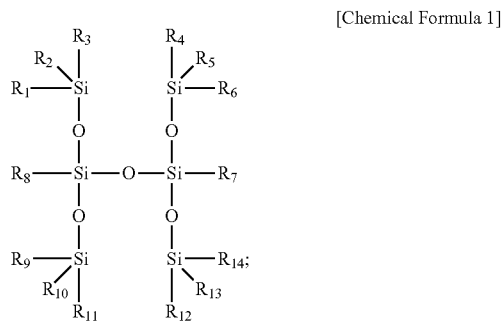

wherein in the above Chemical Formula 1, $R_1$ to $R_{14}$ are each independently H or a substituted or non-substituted $C_1$-$C_5$ alkyl group, and if the $R_1$ to $R_{14}$ are substituted, their substituents include an amino group, a hydroxyl group, a cyano group, a halogen group, a nitro group, or a methoxy group.

As for the preparing method of a plasma polymerized thin film having low dielectric constant according to the second aspect, further detailed descriptions of parts of the second aspect, which overlap with those of the first aspect, may be omitted hereinafter, but the descriptions of the first aspect of the present disclosure may be identically applied to the second aspect of the present disclosure, even though they are omitted hereinafter.

The first precursor may be represented by the following Chemical Formula 2, but may not be limited thereto:

[Chemical Formula 2]

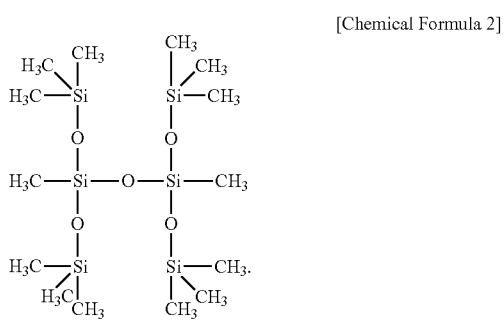

For example, the first precursor may include 1,1,1,3,5,7,7-octamethyl-3,5-bis(trimethylsiloxy)tetrasiloxane (hereinafter, referred to as "OM(TMS)TS").

The preparing method to prepare the plasma polymerized thin film having low dielectric constant includes using a first precursor material having an H-shaped structure different in structure from a precursor material which has been conventionally used for a plasma polymer and has nanopores within the plasma-polymerized thin film. Thus, the plasma polymerized thin film having low dielectric constant can have a mechanical strength required for conventional semiconductor process and a lower dielectric constant value.

Further, the plasma polymerized thin film having low dielectric constant prepared by the preparing method using the first precursor material is thus thermally stable and has a very low dielectric constant. Thus, it can substitute for a dielectric which is used for multilayered metal wires of a semiconductor device and can also improve resistance capacitance delay (RC delay) which increases with the miniaturization of the multilayered metal wires.

In accordance with an embodiment of the present disclosure, the process of depositing a plasma-polymerized thin film on a substrate may include depositing the plasma-polymerized thin film on the substrate using a second precursor material, which is a hydrocarbon in a liquid state at 25° C. and 1 atm, together with the first precursor material, but may not be limited thereto. Meanwhile, the plasma polymerized thin film having low dielectric constant may be prepared using only the first precursor material without using the second precursor material.

The second precursor material may be a hydrocarbon in a liquid state at 25° C. and 1 atm. If the second precursor material is hydrocarbon, it can have good bonding force with respect to the first precursor material and can make it easy to form a plasma-polymerized thin film. Further, it has advantages in that the mechanical strength and the elasticity of the film can be improved due to the presence of multiple $C-H_x$ bonding structures. Furthermore, the second precursor material is preferably hydrocarbon in a liquid state under the standard conditions (25° C. and 1 atm) as described above for the application to a bubbler of a plasma-enhanced chemical vapor deposition (PECVD) apparatus to be described later. In general, it is easy to apply a material in a liquid state under the standard conditions to a bubbler. Further, the material in a liquid state has a higher stability in the deposition of a thin film than in a solid state and can be stored in a greater amount than in a gas state. Thus, hydrocarbon in a liquid state may be desirable in consideration of the function of the bubbler (i.e., vaporization of a precursor).

In accordance with an embodiment of the present disclosure, the second precursor material may include $C_6$-$C_{12}$ alkane, alkene, cycloalkane, or cycloalkene, but may not be limited thereto. If the carbon number of the second precursor material is less than $C_6$, it is difficult for the second precursor material to be in a liquid state under the standard conditions. Further, since the second precursor material has a low molecular weight, the cross-linking power with the first precursor material decreases. Thus, a thin film may not be easily deposited. Meanwhile, if the carbon number of the second precursor material is greater than $C_{12}$, the second precursor material may be in a solid state under the standard conditions. Thus, it may be difficult to vaporize the second precursor material from the bubbler.

In accordance with an embodiment of the present disclosure, the second precursor material may include cyclohexane, but may not be limited thereto.

The first precursor material and the second precursor material may be combined and used at the same time. As described above, the first precursor material and the second precursor material can readily form cross-linking due to their chemical and structural characteristics. Thus, the stability of the thin film can be increased. Therefore, a plasma-polymerized thin film having improved mechanical properties with a low dielectric constant can be provided.

In accordance with an embodiment of the present disclosure, the preparing method may further include performing an after-treatment to the thin film deposited on the substrate, but may not be limited thereto.

In accordance with an embodiment of the present disclosure, the after-treatment may be performed through a process selected from the group consisting of an inductively coupled plasma (ICP) process, a rapid thermal annealing (RTA), and a combination thereof, but may not be limited thereto. The dielectric constant can be improved by forming pores in the dielectric through the after-treatment and using a method of lowering the dielectric constant. Herein, the H-shaped Si—O bonding of the first precursor material is more solid than other bondings, and, thus, the properties of the polymer formed by depositing the first precursor material can be maintained. The after-treatment may not be performed, or may be performed using one or two of the above-described processes.

Hereafter, the preparing method of a plasma polymerized thin film having low dielectric constant according to an example of the present disclosure will be described in more detail with reference to the accompanying drawings.

FIG. 1 illustrates a plasma-enhanced chemical vapor deposition (PECVD) apparatus used for preparing a plasma polymerized thin film having low dielectric constant according to an example of the present disclosure.

As illustrated in FIG. 1, the PECVD apparatus used for preparing a plasma polymerized thin film having low dielectric constant according to an example of the present disclosure includes first and second carrier gas storage units 10 and 11 containing a carrier gas such as argon (Ar), first and second flow rate controllers 20 and 21 for controlling the number of moles of gases passing therethrough, first and second bubblers 30 and 31 containing solid or liquid precursors, and a reactor 40 in which a predetermined reaction zone is defined. The carrier gas storage units 10 and 11, the flow rate controllers 20 and 21, the bubblers 30 and 31, and the reactor 40 are connected through a transfer line 50. The reactor 40 includes an RF electrode 41 located under a substrate 1, an ICP RF coil 42 located on an upper part of the reactor 40, and a shower head 43 having multiple openings to uniformly supply a gas. An exhaust system is provided under the reactor 40 to discharge various materials remaining in the reactor 40 during or after the deposition reaction.

A method of depositing a thin film using the above-described PECVD apparatus is as follows.

In accordance with an embodiment of the present disclosure, the process of depositing a plasma-polymerized thin film on a substrate may include vaporizing the first precursor material and the second precursor material in a bubbler; transferring the vaporized precursor materials from the bubbler and introducing the discharged precursor materials into a plasma deposition reactor; and forming a plasma-polymerized thin film on the substrate in the reactor by using plasma of the reactor, but may not be limited thereto.

The first and second bubblers 30 and 31 contain the first precursor material and the second precursor material, respectively, and the first and second bubblers 30 and 31 are heated to temperatures sufficient to vaporize the respective precursor materials. Herein, each precursor material can be contained in any one of the two bubblers 30 and 31, and the heating temperature of each bubbler may be controlled depending on the type of precursor material in the bubbler.

Each of the first and second carrier gas storage units 10 and 11 may contain argon (Ar), helium (He), neon (Ne) or a combination thereof as a carrier gas, and the carrier gas flows through the transfer line 50 by means of the first and the second flow rate controllers 20 and 21. The carrier gas flowing along the transfer line 50 generates bubbles by being introduced into a precursor solution of the bubblers 30 and 31 via bubbler inlet lines, and then flows into the transfer line 50 again loading the gaseous precursors via bubbler outlet lines. In this case, the ratio of the first and second precursor materials supplied into the reactor 40 may be adjusted by adjusting the flow rate of the first and second carrier gases.

For example, the first and second precursor materials may be supplied into the reactor at a flow rate ratio of first carrier gas:second carrier gas ranging from 1:1 to 1:5, but the flow rate ratio is not particularly limited thereto. The carrier gas and the vaporized precursors flowing along the transfer line 50 via the bubblers 30 and 31 are sprayed through the shower head 43 of the reactor 40, and at this time, the RF electrode 41 activates a reactant gas sprayed through the shower head 43. The activated precursors, after being sprayed through the shower head 43 of the reactor 40, are deposited on the substrate 1 to become a thin film. The gas remaining after the completion of the deposition reaction is exhausted to the outside via the exhaust system provided under the reactor 40.

In accordance with an embodiment of the present disclosure, the reactor may contain a carrier gas selected from the group consisting of argon (Ar), helium (He), neon (Ne), and combinations thereof, but may not be limited thereto. For example, the reactor may contain Ar as a carrier gas.

In accordance with an embodiment of the present disclosure, the carrier gas in the reactor may have a pressure of from $1\times10^{-1}$ Torr to $100\times10^{-1}$ Torr, but may not be limited thereto.

In accordance with an embodiment of the present disclosure, the substrate in the reactor may have a temperature of from about 20° C. to about 200° C., but may not be limited thereto. If the substrate has a temperature out of the above-described range, it is difficult to form a thin film having appropriate properties. When the substrate has a temperature of 200° C., a thin film deposition rate tends to decrease. Further, the substrate temperature higher than 200° C. may suppress the formation of C—$H_z$ in the thin film and cause the formation of $SiO_2$.

In accordance with an embodiment of the present disclosure, power supplied to the reactor may be from 10 W to 90 W, but may not be limited thereto. If the supplied power is higher or lower than the above-described range, a thin film with low dielectric constant having desired properties may not be formed.

The pressure of the carrier gas, the temperature of the substrate 1, and the supplied power described above are set to form the plasma having an optimal range for activating the precursor materials and depositing the precursor materials on the substrate 1, and the range can be appropriately adjusted depending on the types of the precursor materials.

Figure 2:
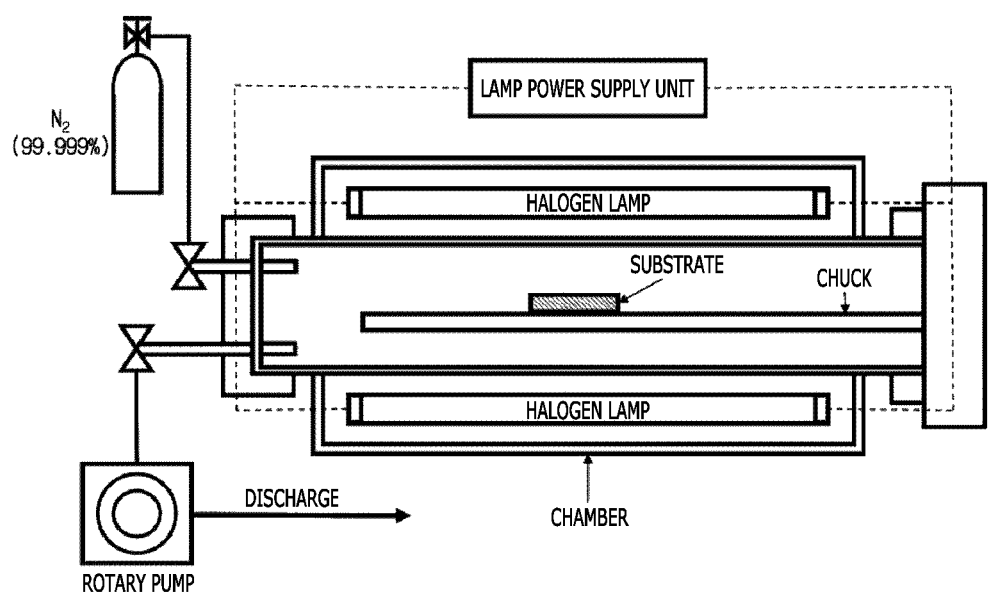
FIG. 2 is a schematic diagram of a rapid thermal annealing (RTA) apparatus used for preparing a plasma polymerized thin film having low dielectric constant according to an example of the present disclosure.

FIG. 2 is a schematic diagram of an RTA apparatus used for preparing a plasma polymerized thin film having low dielectric constant according to an example of the present disclosure.

The RTA apparatus may be used to perform heat treatment for a specimen, activate electrons in a semiconductor device process, and/or change the interface between a thin film and another thin film or between a wafer and a thin film. Further, the RTA apparatus may be used to convert the state of the grown thin film and decrease the loss caused by an ion implantation. The RTA is conducted by a heated halogen lamp and a hot chuck. RTA has a short process duration time unlike a furnace, and, thus, it is also referred to as rapid thermal process (RTP). With this heat treatment apparatus, an after-treatment can be performed to the thin film that has been plasma-deposited in the prior process.

The inside of the RTA apparatus is surrounded by multiple halogen lamps, and the lamps generate heat while emitting orange light. This RTA apparatus may perform a heat treatment at about 300° C. to about 600° C. to the thin film that has been plasma-deposited in the prior process and the substrate 1 on which the thin film is placed. If the temperature is lower than 300° C. during the after-treatment, the properties of the initially deposited thin film may not be changed, and if the temperature is higher than 600° C. during the after-treatment, the structure of the thin film may be transformed from a thin film with low dielectric constant to an $SiO_2$-like thin film. It is more preferable to rapidly increase the initial temperature to a temperature in the range of about 300° C. to about 600° C. within about 5 minutes, and conduct the heat treatment for about 1 minute to about 5 minutes, such that the structure of the thin film can be effectively changed. The after-treatment, i.e., RTA, may be conducted using nitrogen gas under a pressure of from about $1\times10^{-1}$ Torr to about $100\times10^{-1}$ Torr.

Hereinafter, the present disclosure will be described in more detail with reference to examples. The following examples are provided only for explanation, but are not intended to limit the scope of the present disclosure.

Example

A silicon wafer was placed on the RF electrode 41 within the reactor 40 and put in a vacuum of $10^{-2}$ Torr by using the PECVD apparatus illustrated in FIG. 1. Then, 1,1,1,3,5,7,7,7-octamethyl-3,5-bis(trimethylsiloxy)tetrasiloxane (hereinafter, referred to as "OM(TMS)TS") as a first precursor material was placed in the first bubbler 30 and heated to 65° C. to vaporize a precursor solution. As a carrier gas, 99.999% ultra-pure argon (Ar) gas was used. The Ar gas flowed along the transfer line 50 via the bubbler 30 and supplied the first precursor material to the shower head 43, and, thus, the first precursor material was sprayed and plasma-deposited on the substrate 1. In this case, alternating current power of 13.56 Hz and 90 W or less was used to generate plasma, and plasma polymerization was performed at a pressure of 1.0 Torr or less and a temperature of 200° C. or less. The plasma-polymerized thin film deposited as described above will be referred to as "ppOM(TMS)TS".

Further, cyclohexane (hereinafter, referred to as "Chex") was selected as a second precursor material for preparing a plasma polymer, and copolymerization was performed by the above-descried preparing method. The plasma-polymerized thin film copolymerized as described above will be referred to as "ppOM(TMS)TS:Chex".

The after-treatment was performed to the ppOM(TMS)TS thin film by using the RTA apparatus illustrated in FIG. 2. The ppOM(TMS)TS thin film was placed on the chuck and heated by 12 halogen lamps surrounding the chuck. The ppOM(TMS)TS thin film was heat-treated at 500° C. for 5 minutes under nitrogen atmosphere. The pressure of the nitrogen gas was set to 1.0 Torr.

Test Example

Figure 3:
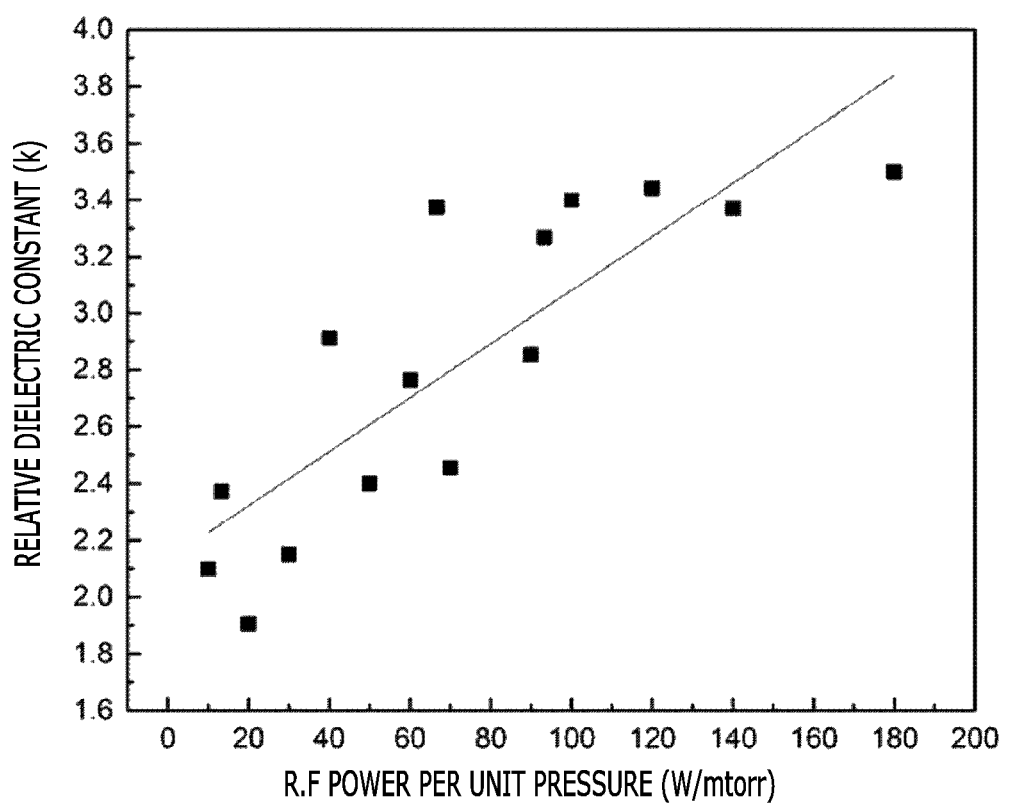
FIG. 3 is a graph showing the relative dielectric constant value of a plasma polymerized thin film having low dielectric constant deposited by using a first precursor material prepared according to an example of the present disclosure.

FIG. 3 is a graph showing the relative dielectric constant value of a plasma polymerized thin film having low dielectric constant (ppOM(TMS)TS thin film) deposited by using a first precursor material prepared according to an example of the present disclosure. Referring to FIG. 3, as the power supplied to the ppOM(TMS)TS thin film increased, the relative dielectric constant value increased from 1.9 to 3.4.

Figure 4:
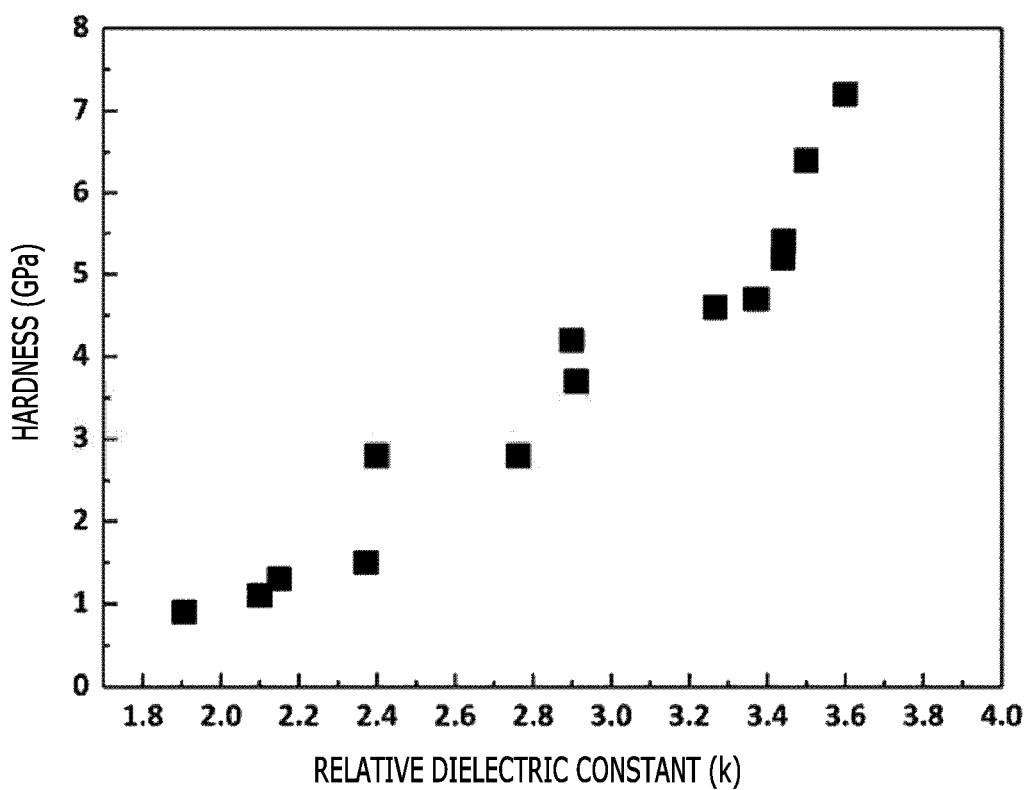
FIG. 4 is a graph showing the hardness of the plasma polymerized thin film having low dielectric constant deposited by using the first precursor material prepared according to an example of the present disclosure.

FIG. 4 is a graph showing the hardness of the plasma polymerized thin film having low dielectric constant (ppOM (TMS)TS thin film) deposited by using the first precursor material prepared according to an example of the present disclosure. Referring to FIG. 4, as the relative dielectric constant increased, the hardness of the ppOM(TMS)TS thin film increased from 1 GPa to 3.6 GPa.

Figure 5:
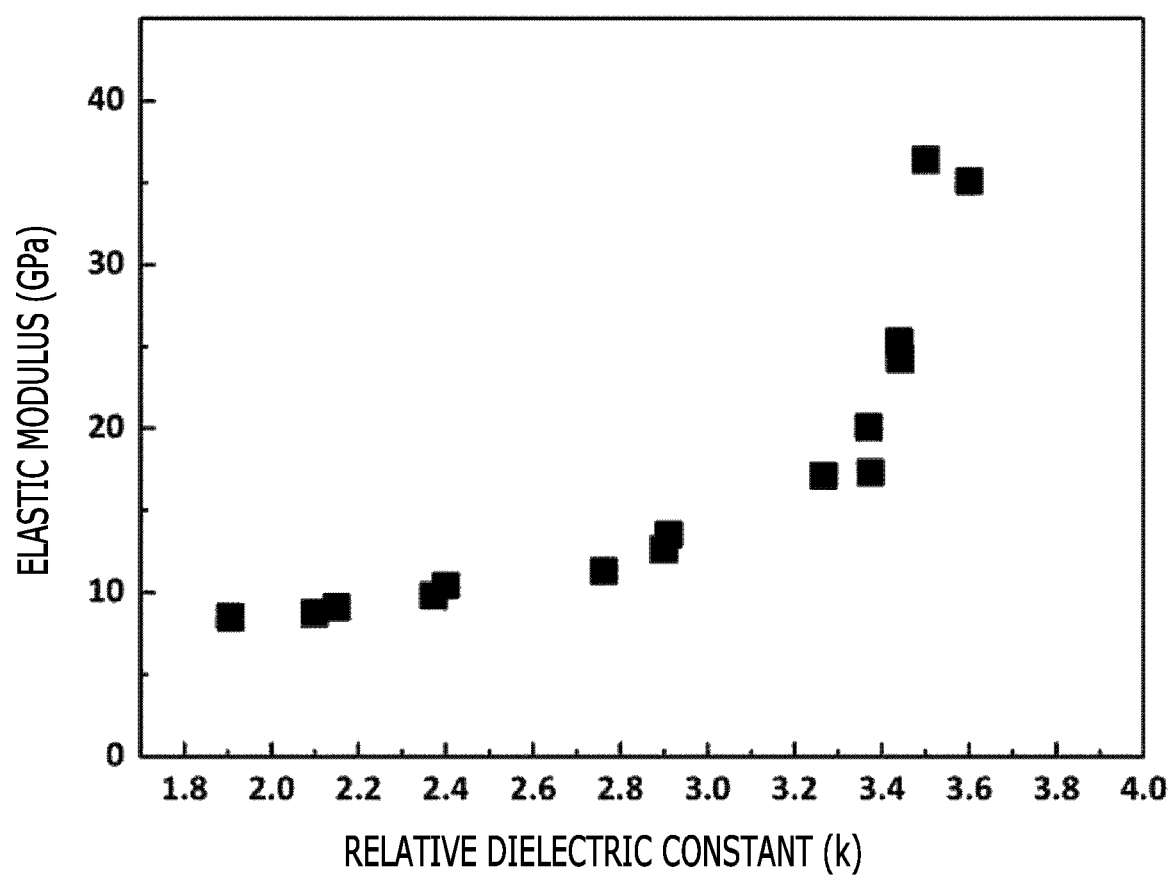
FIG. 5 is a graph showing the elastic modulus of the plasma polymerized thin film having low dielectric constant deposited by using the first precursor material prepared according to an example of the present disclosure.

FIG. 5 is a graph showing the elastic modulus of the plasma polymerized thin film having low dielectric constant (ppOM(TMS)TS thin film) deposited by using the first precursor material prepared according to an example of the present disclosure. Referring to FIG. 5, as the relative dielectric constant increased, the elastic modulus of the ppOM(TMS)TS thin film increased from 8 GPa to 35 GPa.

Figure 6:
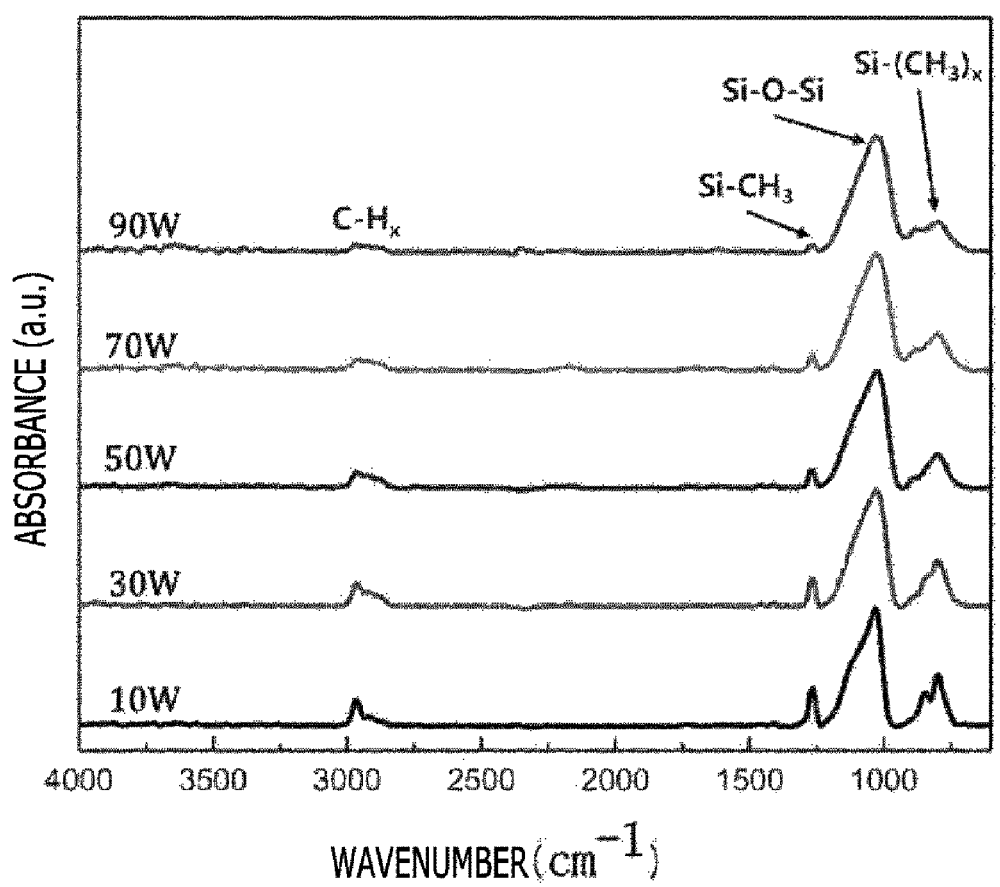
FIG. 6 is a graph about a Fourier transform infrared spectroscopy chemical structure of the plasma polymerized thin film having low dielectric constant deposited by using the first precursor material prepared according to an example of the present disclosure.

FIG. 6 is a graph about a Fourier transform infrared spectroscopy chemical structure of the plasma polymerized thin film having low dielectric constant deposited by using the first precursor material prepared according to an example of the present disclosure. FIG. 6 is a graph showing the chemical structure of the ppOM(TMS)TS thin film depending on the applied power. As shown in the graph, it can be seen that Si—O—Si bonding structures and Si—$(CH_3)_x$ bonding structures basically account for the majority of the ppOM(TMS)TS thin film. Particularly, as the power increased, C—$H_x$ bonding structures, Si—$CH_3$ bonding structures, and Si—$(CH_3)_x$ bonding structures decreased, whereas Si—O—Si bonding structures were maintained. The C—$H_x$ bonding structures, Si—$CH_3$ bonding structures and Si—$(CH_3)_x$ bonding structures can induce a relatively lower dielectric constant, and the Si—O—Si bonding structures can induce a higher mechanical strength. Therefore, FIG. 3 shows that the dielectric constant increases as the plasma power increases, and FIG. 4 and FIG. 5 show that the mechanical strength, i.e., the hardness and elastic modulus of the thin film, increases as the dielectric constant increases.

Figure 7:
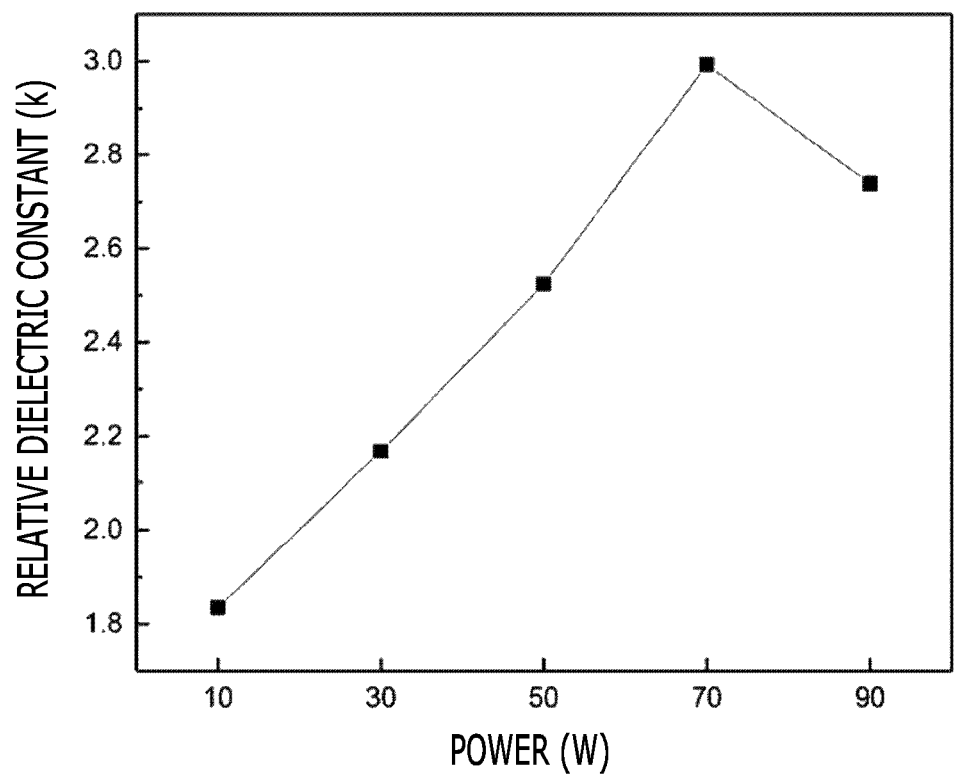
FIG. 7 is a graph showing the relative dielectric constant value of a plasma polymerized thin film having low dielectric constant deposited by using the first precursor material prepared according to an example of the present disclosure together with a second precursor material.

FIG. 7 is a graph showing the relative dielectric constant value of a plasma polymerized thin film having low dielectric constant (ppOM(TMS)TS:Chex thin film) deposited by using the first precursor material prepared according to an example of the present disclosure together with a second precursor material. Referring to FIG. 7, as the power increased during the deposition of the ppOM(TMS)TS:Chex thin film, the relative dielectric constant value increased from 1.8 to 3.0.

Figure 8:
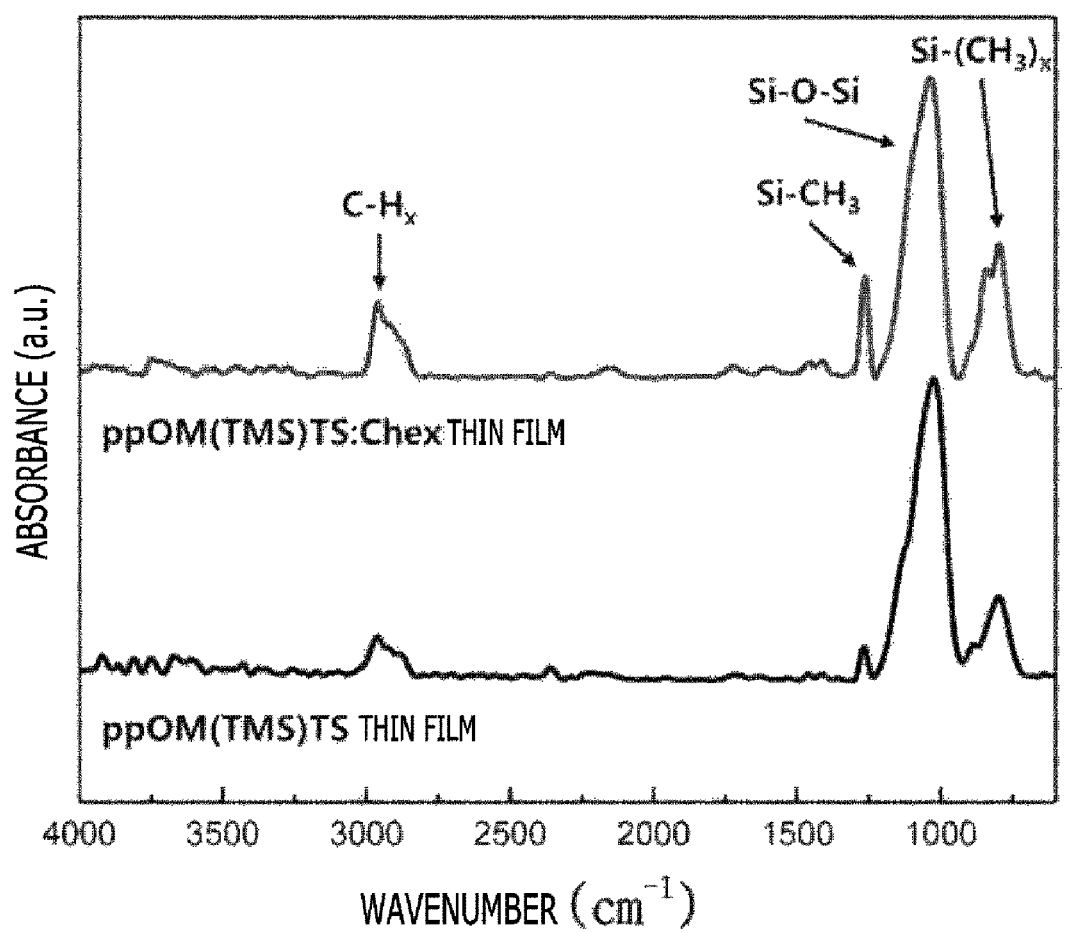
FIG. 8 is a graph about a Fourier transform infrared spectroscopy chemical structure of the plasma polymerized thin film having low dielectric constant deposited by using the first precursor material prepared according to an example of the present disclosure together with the second precursor material and a Fourier transform infrared spectroscopy chemical structure of the plasma polymerized thin film having low dielectric constant deposited by using the first precursor material.

FIG. 8 is a graph of a Fourier transform infrared spectroscopy chemical structure of the plasma polymerized thin film having low dielectric constant (ppOM(TMS)TS:Chex thin film) deposited by using the first precursor material prepared according to an example of the present disclosure together with the second precursor material and a Fourier transform infrared spectroscopy chemical structure of the plasma polymerized thin film having low dielectric constant (ppOM(TMS)TS thin film) deposited by using the first precursor material. Referring to FIG. 8, it can be seen that when the second precursor material was added, the C—$H_x$ bonding structures, Si—$CH_3$ bonding structures and Si—$(CH_3)_x$ bonding structures increased compared to the Si—O—Si bonding structures.

Figure 9:
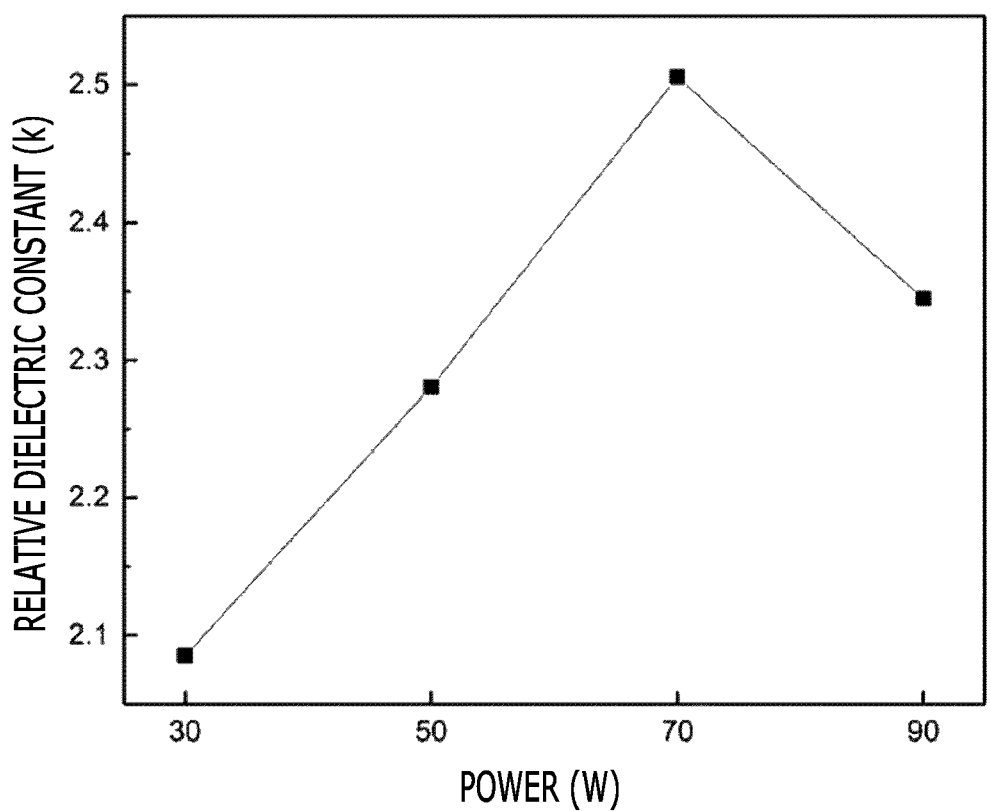
FIG. 9 is a graph showing the relative dielectric constant value of the plasma polymerized thin film having low dielectric constant prepared according to an example of the present disclosure after an after-treatment.

FIG. 9 is a graph showing the relative dielectric constant value of the plasma polymerized thin film having low dielectric constant (ppOM(TMS)TS thin film) prepared according to an example of the present disclosure after an after-treatment. Referring to FIG. 9, as the power increased during the deposition of the ppOM(TMS)TS thin film after the after-treatment, the relative dielectric constant value increased from 2.0 to 2.5. Accordingly, it could be seen that if the after-treatment, i.e., RTA, is performed to the ppOM (TMS)TS thin film, the relative dielectric constant value of the thin film decreases.

Figure 10:
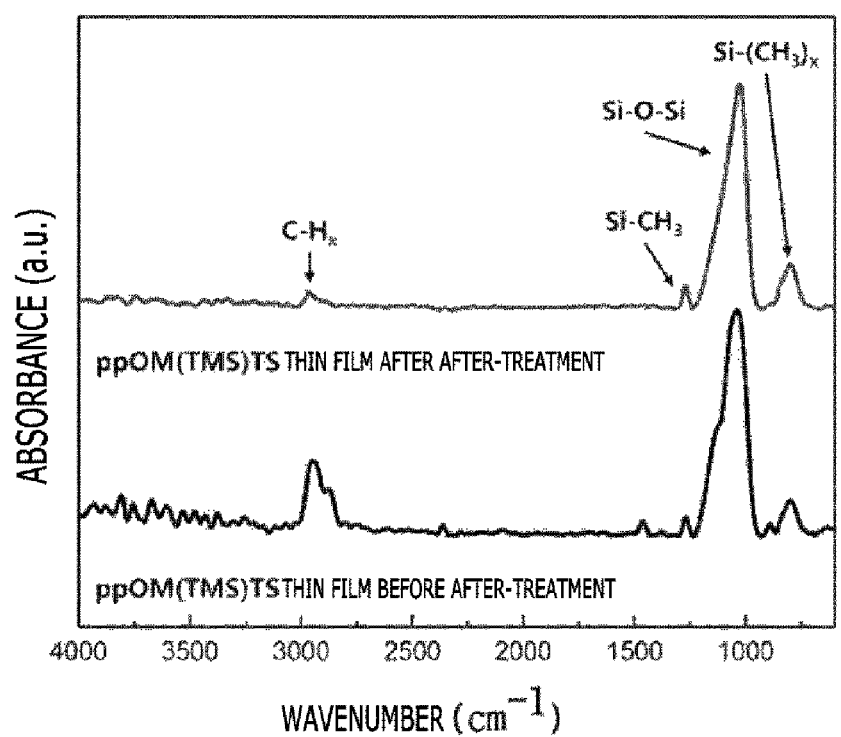
FIG. 10 is a graph about Fourier transform infrared spectroscopy chemical structures of the plasma polymerized thin film having low dielectric constant prepared according to an example of the present disclosure before and after an after-treatment.

FIG. 10 is a graph of Fourier transform infrared spectroscopy chemical structures of the plasma polymerized thin film having low dielectric constant (ppOM(TMS)TS thin film) prepared according to an example of the present disclosure before and after an after-treatment. Referring to FIG. 10, hydrocarbon having relatively weak bonding power was vaporized through the after-treatment, and the C—$H_x$ bonding structures, Si—$CH_3$ bonding structures and Si—$(CH_3)_x$ bonding structures decreased compared to the Si—O—Si bonding structures.

According to the above-described aspects of the present disclosure, a plasma polymerized thin film having low dielectric constant of the present disclosure is prepared using a precursor material having an H-shaped structure different in structure from a precursor material which has been conventionally used for a plasma polymer. Thus, the plasma polymerized thin film having low dielectric constant can have a mechanical strength required for conventional semiconductor process and a lower dielectric constant value.

Figure 11:
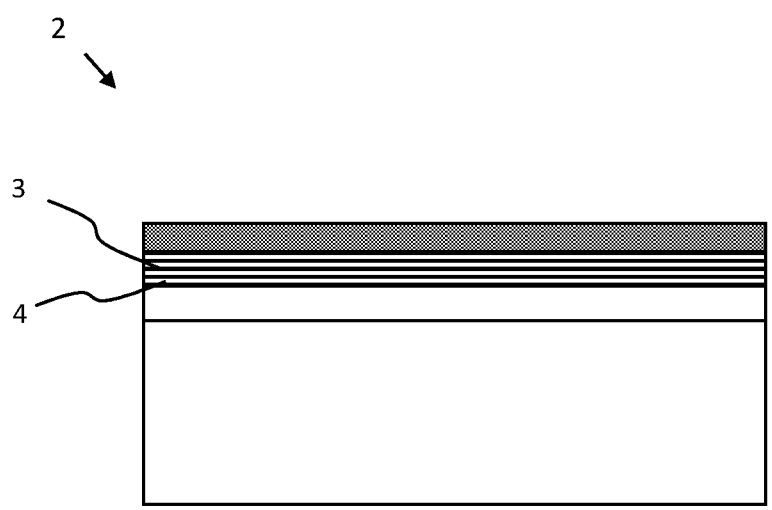
FIG. 11 shows a semiconductor device including multi-layered metal wires and a thermally stable plasma polymerized thin film having low dielectric constant according to one or more examples of the present disclosure.

The plasma polymerized thin film having low dielectric constant of the present disclosure is thermally stable and has a very low dielectric constant. Thus, it can substitute for a dielectric which is used for multilayered metal wires of a semiconductor device and can also improve resistance capacitance delay (RC delay) which increases with the miniaturization of the multilayered metal wires. FIG. 11 shows a semiconductor device 2 including multilayered metal wires 3 and a thermally stable plasma polymerized thin film 4 having very low dielectric constant according to one or more examples of the present disclosure.

For example, the plasma polymerized thin film having low dielectric constant of the present disclosure can maintain properties required for a semiconductor process and also reduce a dielectric constant. Thus, it can be directly applied to a multilayered metal wiring process and can also improve the above-described RC delay.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. For example, each component described to be of a single type can be implemented in a distributed manner. Likewise, components described to be distributed can be implemented in a combined manner. Therefore, the scope of the disclosure is defined not by the detailed description, but by the claims and their equivalents, and all variations within the scope of the claims and their equivalents are to be construed as being included in the disclosure.

We claim:

1. A plasma polymerized thin film having low dielectric constant prepared by depositing a first precursor material represented by the following Chemical Formula 1:

[Chemical Formula 1]

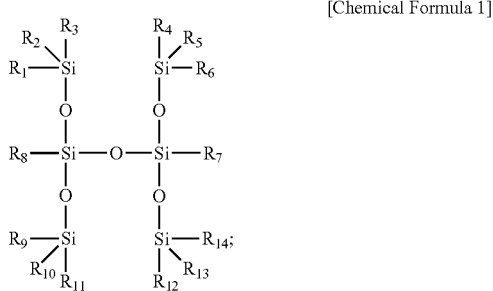

wherein in the above Chemical Formula 1, $R_1$ to $R_{14}$ are each independently H or a substituted or non-substituted $C_1$-$C_5$ alkyl group, and when the $R_1$ to $R_{14}$ are substituted, their substituents comprise an amino group, a hydroxyl group, a cyano group, a halogen group, a nitro group, or a methoxy group.

2. The plasma polymerized thin film having low dielectric constant of claim 1,
wherein the plasma polymerized thin film having low dielectric constant is prepared by depositing a second precursor material, which is a hydrocarbon in a liquid state at about 25° C. and about 1 atm, together with the first precursor material.

3. The plasma polymerized thin film having low dielectric constant of claim 2,
wherein the second precursor material comprises $C_6$-$C_{12}$ alkane, alkene, cycloalkane, or cycloalkene.

4. The plasma polymerized thin film having low dielectric constant of claim 2,
wherein the second precursor material comprises cyclohexane.

5. The plasma polymerized thin film having low dielectric constant of claim 1,
wherein the first precursor material comprises an H-shaped structure.

6. The plasma polymerized thin film having low dielectric constant of claim 1,
prepared by plasma-enhanced CVD (PECVD).

7. A method of preparing a plasma polymerized thin film having low dielectric constant, the method comprising:
depositing a plasma-polymerized thin film on a substrate using a first precursor material represented by the following Chemical Formula 1:

[Chemical Formula 1]

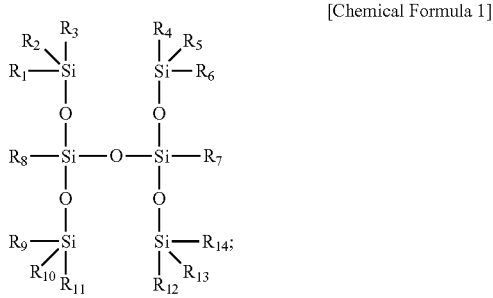

wherein in the above Chemical Formula 1, $R_1$ to $R_{14}$ are each independently H or a substituted or non-substituted $C_1$-$C_5$ alkyl group, and when the $R_1$ to $R_{14}$ are substituted, their substituents comprise an amino group, a hydroxyl group, a cyano group, a halogen group, a nitro group, or a methoxy group.

8. The method of preparing a plasma polymerized thin film having low dielectric constant of claim 7,
wherein the depositing a plasma-polymerized thin film on a substrate comprises depositing using a second precursor material, which is a hydrocarbon in a liquid state at about 25° C. and about 1 atm, together with the first precursor material.

9. The method of preparing a plasma polymerized thin film having low dielectric constant of claim 8,
wherein the second precursor material comprises $C_6$-$C_{12}$ alkane, alkene, cycloalkane, or cycloalkene.

10. The method of preparing a plasma polymerized thin film having low dielectric constant of claim 8,
wherein the second precursor material comprises cyclohexane.

11. The method of preparing a plasma polymerized thin film having low dielectric constant of claim 7, further comprising:
performing an after-treatment to the thin film deposited on the substrate.

12. The method of preparing a plasma polymerized thin film having low dielectric constant of claim 11,
wherein the after-treatment is performed through a process selected from the group consisting of an inductively coupled plasma (ICP) process, a rapid thermal annealing (RTA), and a combination thereof.

13. The method of preparing a plasma polymerized thin film having low dielectric constant of claim 7,
wherein the depositing a plasma-polymerized thin film on a substrate comprises:
vaporizing the first precursor material and the second precursor material in a bubbler;
transferring the vaporized precursor materials from the bubbler and introducing the transferred precursor materials into a plasma deposition reactor; and
forming a plasma-polymerized thin film on the substrate in the reactor by using plasma of the reactor.

14. The method of preparing a plasma polymerized thin film having low dielectric constant of claim 13,
wherein the reactor contains a carrier gas selected from the group consisting of argon (Ar), helium (He), neon (Ne), and combinations thereof.

15. The method of preparing a plasma polymerized thin film having low dielectric constant of claim 13,
wherein the carrier gas in the reactor has a pressure of from about $1 \times 10^{-1}$ Torr to about $100 \times 10^{-1}$ Torr.

16. The method of preparing a plasma polymerized thin film having low dielectric constant of claim 13,
wherein the substrate in the reactor has a temperature of from about 20° C. to about 200° C.

17. The method of preparing a plasma polymerized thin film having low dielectric constant of claim 13,
wherein power supplied to the reactor is from about 10 W to about 90 W.

* * * * *